United States Patent
Barsun et al.

(12)

(10) Patent No.: US 7,082,032 B1
(45) Date of Patent: Jul. 25, 2006

(54) HEAT DISSIPATION DEVICE WITH TILTED FINS

(75) Inventors: Stephan Karl Barsun, Davis, CA (US); James D. Hensley, Rocklin, CA (US); Andrew Harvey Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 203 days.

(21) Appl. No.: 10/648,532

(22) Filed: Aug. 25, 2003

(51) Int. Cl.
*H05K 7/20* (2006.01)

(52) U.S. Cl. .................. 361/703; 361/704; 165/80.3; 257/713; 257/722; 174/16.3

(58) Field of Classification Search ............. 361/703, 361/694–695, 697; 257/722; 165/80.3, 165/185, 121, 122; 174/16.3
See application file for complete search history.

(56) References Cited

U.S. PATENT DOCUMENTS

| 4,352,008 A | * | 9/1982 | Hofer et al. ............. 219/540 |
| 6,301,779 B1 | * | 10/2001 | Azar ................... 29/890.03 |
| 6,525,940 B1 | * | 2/2003 | Chen et al. .............. 361/697 |
| 6,674,644 B1 | * | 1/2004 | Schulz .................. 361/728 |
| 6,704,199 B1 | * | 3/2004 | Wiley ................... 361/695 |
| 6,735,082 B1 | * | 5/2004 | Self ..................... 361/703 |
| 6,736,204 B1 | * | 5/2004 | Gollan et al. ........... 165/185 |
| 2004/0032718 A1 | * | 2/2004 | Self ..................... 361/703 |

* cited by examiner

*Primary Examiner*—Lynn Feild
*Assistant Examiner*—Zachary M Pape

(57) ABSTRACT

A heat dissipation apparatus comprising a base and a plurality of fins connected to the base and extending out from the base at a non-orthogonal angle to the base.

7 Claims, 3 Drawing Sheets

HEAT DISSIPATION DEVICE WITH TILTED FINS

TECHNICAL FIELD

Embodiments of the present invention relate to the field of cooling electronic componentry. More particularly, embodiments of the present invention relate to heat dissipation devices.

BACKGROUND ART

Heat dissipation devices are used to cool components of electronic devices, such as microprocessors. Typical heat dissipation devices, also referred to as heat sinks, include a base having a flat surface that can be mounted to the component being cooled. Attached to the other surface of the base are a number of fins. Heat from the component is transferred to the base, from the base to the fins, and then to the air. The fins provide increased surface area for the heat dissipation device that enhances dissipation of the heat from the base. To provide additional cooling, a fan can direct air over the base element and across the surface area of the fins.

As computer components become smaller and more powerful, keeping them cool is becoming a greater challenge. For example, high performance microprocessors generate more heat than their lower performance counterparts, and are smaller in size than previous microprocessors, further increasing the density of heat generated.

In an effort to decrease the size of computer systems, computer components are placed into smaller chassis or housings. A consequence of placing more computer components into a smaller space is that less height is available within the chassis for heat dissipation devices. Furthermore, computer components such as dual in-line memory modules (DIMMs) are often taller than the chassis within which they are being placed is tall. As such, DIMMS and other computer components may be placed within the chassis at an angle.

FIG. 1 illustrates placement of various computer components within housing 100 in accordance with the prior art. Comprised within housing 100 is circuit board 105 that is connected to a plurality of card connectors 110a–110d. Card connectors 110a–110d are connected to cards 115a–115d, respectively, where cards 115a–115d extend out from card connectors 110a–110d at an angle. Furthermore, circuit board 105 is connected to processor 120. Mounted atop processor 120 is heat sink 125 having a number of vertical fins 130.

As shown, there must be sufficient distance between card connector 110b and processor 120 for card 115b to be inserted to and extracted from card connector 110b without coming in contact with vertical fins 130. This distance may cause the length of housing 100 to be longer than necessary. Furthermore, due to the height of housing 100, the surface area of heat sink 125 may not be sufficient to cool processor 120. In order to ensure that processor 120 is cooled sufficiently, it may be necessary to use a lower performance processor, decreasing the performance of the computer system. Alternatively, a heat sink with more surface area (e.g., longer vertical fins) may be used to cool processor 120, resulting in increased height of housing 100, thereby increasing the volume of housing 100. Larger housings reduce the number of computer systems that can be placed in a room or a rack.

Accordingly, a device that can provide for cooling components of a computer system while allowing for denser component placement would be advantageous. A device that can accomplish this within the confines of smaller housings currently in use, without significantly increasing costs or reducing performance, would also be advantageous. Furthermore, a device that can provide for increased cooling of components of a computer system, thereby allowing for more powerful components in a smaller housing, would be particularly advantageous.

DISCLOSURE OF THE INVENTION

Embodiments of the present invention pertain to heat dissipation device. In one embodiment, the heat dissipation device comprises a base and a plurality of fins connected to the base and extending out from the base at a non-orthogonal angle to the base.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should not be understood as being drawn to scale except if specifically noted.

BEST MODE FOR CARRYING OUT THE INVENTION

Reference will now be made in detail to various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description of the present invention, numerous specific details are set forth in order to provide a thorough understanding of the present invention. In other instances, well-known methods, procedures, components, and circuits have not been described in detail as not to unnecessarily obscure aspects of the present invention.

Aspects of the present invention may be implemented in a computer system that includes, in general, a processor for processing information and instructions, random access (volatile) memory (RAM) for storing information and instructions, read-only (non-volatile) memory (ROM) for storing static information and instructions, a data storage device such as a magnetic or optical disk and disk drive for storing information and instructions, an optional user output device such as a display device (e.g., a monitor) for displaying information to the computer user, an optional user input device including alphanumeric and function keys (e.g., a keyboard) for communicating information and command selections to the processor, and an optional user input device such as a cursor control device (e.g., a mouse) for communicating user input information and command selections to the processor.

Figure 1:
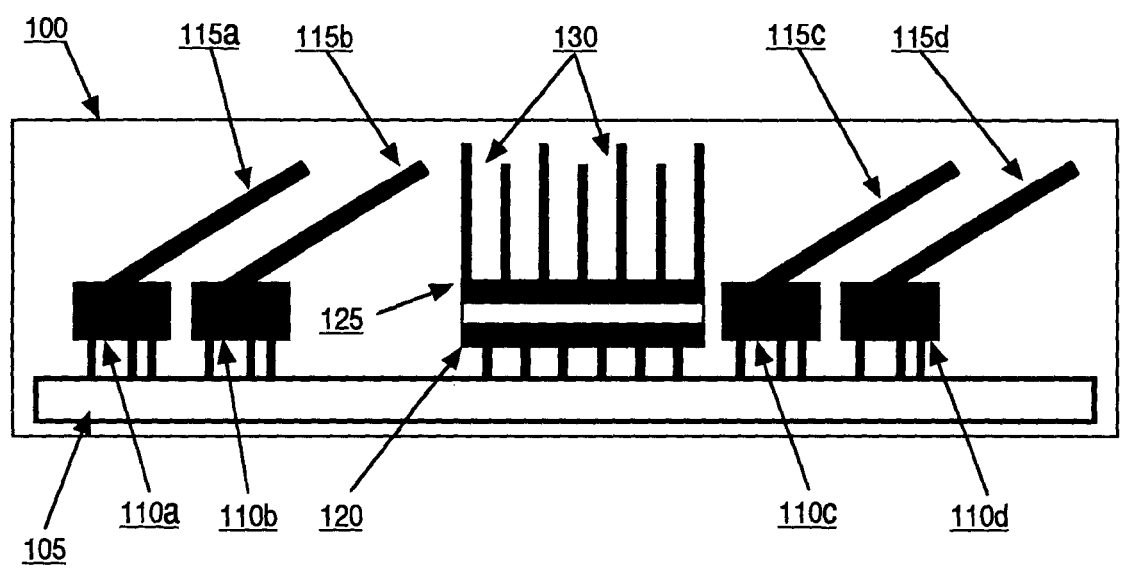
FIG. 1 illustrates a side view of placement of computer components within a housing in accordance with the prior art.
Figure 2:
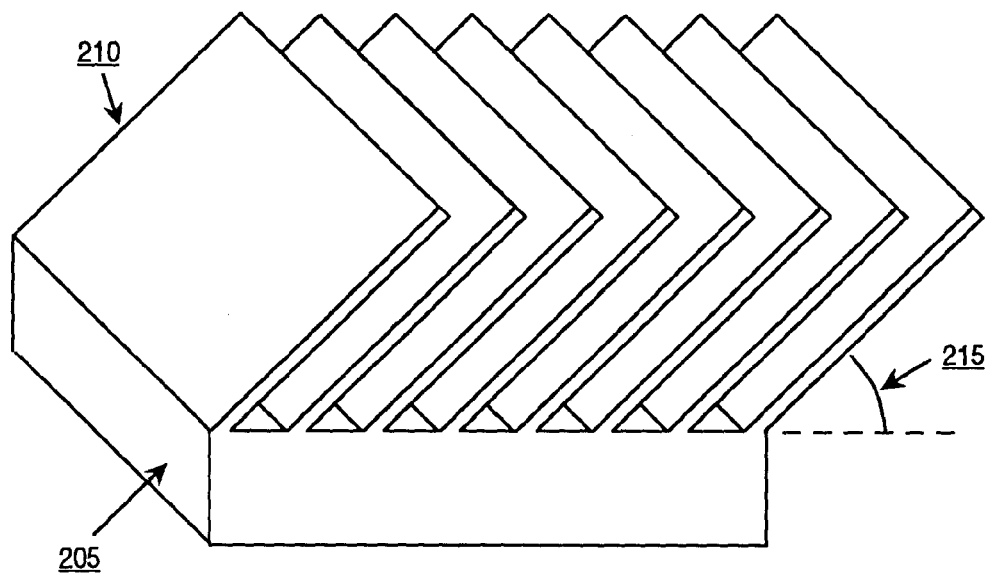
FIG. 2 illustrates a perspective view of a heat dissipation device in accordance with an embodiment of the present invention.

FIG. 2 illustrates a perspective view of a heat dissipation device 200 in accordance with an embodiment of the present invention. Heat dissipation device 200 can also be referred to as a heat sink or heat exchanger. In the present embodiment, heat dissipation device 200 includes a base element 205 and a number of fins exemplified by fin 210. The fins extend out from base 205 at a non-orthogonal angle 215. In one embodiment, non-orthogonal 215 angle is forty-five degrees. Accordingly, the fins can also be referred to as tilted fins. It should be appreciated that there can be any number of fins, and that the fins can be of any length. In particular, the fins can be of uniform length, although the present invention is not so limited.

Base 205 and the fins can be made of any suitable material including, but not limited to, aluminum or copper. In one embodiment, heat dissipation device 200 is configured to be thermally coupled to a component for dissipating heat generated by the component.

Heat dissipation device 200 is said to be "thermally coupled" to the component, meaning that the base element 205 is fit tightly against the component in order to facilitate heat transfer from the component into the base element 205. A thermal compound of a type known in the art can be used between the base element 205 and the component to further facilitate heat transfer. Although the component and base element 205 are illustrated (e.g., heat generating component 420 and tilted fin heat sink 425 of FIG. 3) as being similarly dimensioned, this need not be the case.

In one embodiment, the component can be an electrical component. In particular, the component can be an electronic component, such as a microprocessor or integrated circuit, that is utilized in a computer system (e.g., within the computer system housing). In general, the component generates heat, and the function of heat dissipation device 200 is to remove that heat and dissipate it to the environment, thereby cooling the component.

Figure 3:
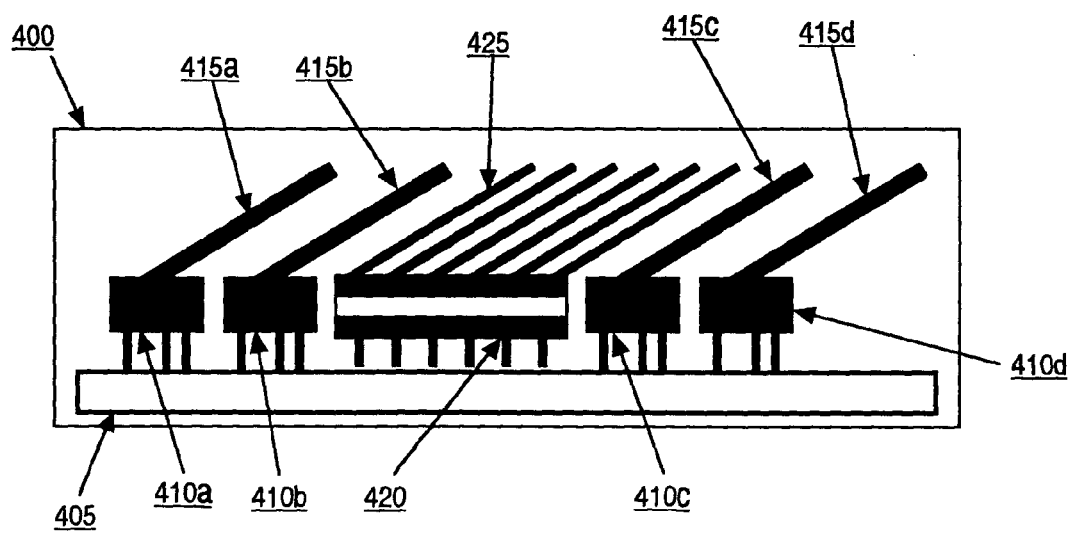
FIG. 3 illustrates a side view of exemplary placement of computer components within a housing in accordance with an embodiment of the present invention.

FIG. 3 illustrates a side view of an exemplary placement of computer components within housing 400 in accordance with an embodiment of the present invention. In one embodiment, housing 400 is a rack-mountable chassis for mounting into a rack. Circuit board 405 is comprised within housing 400. Circuit board 405 is electrically coupled to a plurality of computer components, including card connectors 410a–410d and heat-generating component 420. Card connectors 410a–410d are configured for receiving cards 415a–415d, respectively, where cards 415a–415d extend out from card connectors 410a–410d at a non-orthogonal angle. It should be appreciated that circuit board 405 can be electrically coupled to any number of computer components, and is not intended to be limited to the present embodiment.

In one embodiment, cards 415a–415d may comprise a dual in-line memory module (DIMM). In another embodiment, cards 415a–415d may comprise an input/output (I/O) card, such as a Peripheral Component Interconnect (PCI) bus. The length of each of cards 415a–415d may be greater than the height of housing 400. Accordingly, card connectors 410a–410d are configured to receive cards 415a–415d at a non-orthogonal angle such that the end of the cards 415a–415d does not come in contact with housing 405. In one embodiment, the non-orthogonal angle is forty-five degrees.

In one embodiment, heat-generating component 420 is a microprocessor utilized in a computer system. In another embodiment, heat-generating component 420 is an integrated circuit utilized in an electronic device. In general, heat-generating component 420 generates heat. Heat generating component is thermally coupled to tilted fin heat sink 425 (e.g., heat dissipation device 200 of FIG. 2). Tilted fin heat sink 425 functions to remove that heat generated by heat-generating component 420 and dissipate it to the environment, thereby cooling heat-generating component 420.

As described above, the fins of tilted fin heat sink 425 are tilted at a non-orthogonal angle. In one embodiment, the angle at which the fins are tilted is substantially equal to the angle at which cards 415a–415d extend out from card connectors 410a–410d, respectively. As such, the components placed within housing 400 may be more densely, as heat generating component 420 may be placed in closed proximity to card connector 410b. Furthermore, the fins of tilted fin heat sink 425 have greater surface area than perpendicular fins, due to the height limitations imposed by housing 400. As such, tilted fin heat sink 425 provides increased heat dissipation, allowing for operation of higher performance components.

Figure 4:
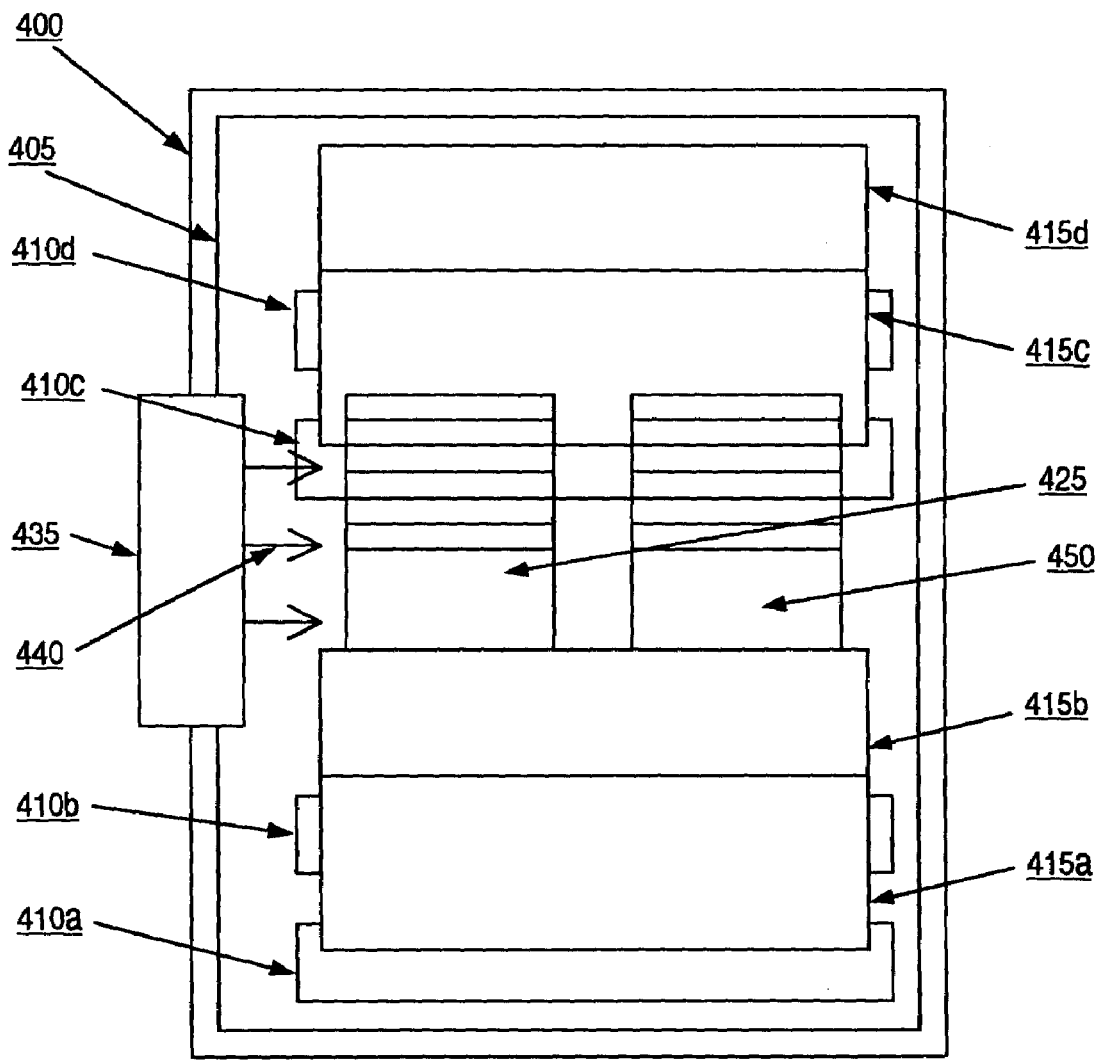
FIG. 4 illustrates a top view of exemplary placement of computer components within a housing in accordance with an embodiment of the present invention.

FIG. 4 illustrates a top view of exemplary placement of computer components within housing 400 in accordance with an embodiment of the present invention. As shown, various computer components appear to overlap each other. For example, card 415b overlaps tilted fin heat sink 425 and heat-generating component 420 (not shown). Furthermore, tilted fin heat sink 425 overlaps connector 410c and card 415c. By providing for overlapping components, the components can be more densely placed within housing 400. Higher component density allows for a higher number of components to be placed within housing 400, or allows for housing 400 to be smaller in size if no extra components are added. Housing 400 may also comprise titled fin heat sink 450 thermally coupled to another heat-generating component (not shown) that is electrically coupled to circuit board 405.

Housing 400 also optionally comprises air source 435 for increasing heat dissipation. In one embodiment, air source 435 is a fan situated at one side of tilted fin heat sink 425, perpendicular to the fins of tilted fin heat sink 425. Multiple fans can be used at either or both ends of tilted fin heat sink 425. Other types of air sources can be used. Air source 435 is operable to move air across tilted fin heat sink 425, providing additional cooling. Arrows 440 indicate the direction of air flow from air source 435.

In summary, embodiments of the present invention provide improved cooling of smaller and more powerful components such as electrical components used in computer systems, particularly computer systems that use smaller chassis, without significantly increasing costs or reducing performance.

Embodiments of the present invention, a heat dissipation device with tilted fins, are thus described. While the present invention has been described in particular embodiments, it should be appreciated that the present invention should not be construed as limited by such embodiments, but rather construed according to the following claims.

What is claimed is:

1. A circuit board comprising:
   a card connector for connecting to a card such that said card extends out from said card connector at a first non-orthogonal angle to said card connector;

an electronic component; and a tilted fin heat sink mounted to said electronic component, wherein fins of said heat sink extend out from a base of said heat sink at a second non-orthogonal angle to said base, and wherein said plurality of fins are substantially parallel; and wherein said card connector and said electronic component are proximately placed such that said card extends out from said card connector and overlaps said fins wherein said fins are at least partially between said circuit board and said card and wherein said card and said fins do not come in physical contact.

2. The circuit board of claim 1 wherein said first non-orthogonal angle and said second non-orthogonal angle are substantially equal.

3. The circuit board of claim 2 wherein said first non-orthogonal angle and said second non-orthogonal angle are substantially forty-five degrees.

4. The circuit board of claim 1 wherein said card and said fins are substantially parallel.

5. The circuit board of claim 1 wherein said card is a dual in-line memory module (DIMM).

6. The circuit board of claim 1 wherein said electronic component is a microprocessor.

7. The circuit board of claim 1 wherein said electronic component is an integrated circuit.

* * * * *